United States Patent [19]
Zheng et al.

[11] Patent Number: 5,858,870
[45] Date of Patent: Jan. 12, 1999

[54] METHODS FOR GAP FILL AND PLANARIZATION OF INTERMETAL DIELECTRICS

[75] Inventors: Jai Zhen Zheng; Simon Yew-Meng Chooi, both of Singapore, Singapore; Lap Chan, San Francisco, Calif.

[73] Assignee: Chartered Semiconductor Manufacturing, Ltd., Singapore, Singapore

[21] Appl. No.: 767,008

[22] Filed: Dec. 16, 1996

[51] Int. Cl.⁶ .................................................. H01L 21/283
[52] U.S. Cl. ........................ 438/622; 438/622; 438/624; 438/626; 438/633; 438/692; 438/697; 438/699; 438/762; 438/780; 438/788; 438/789
[58] Field of Search ................................. 438/622, 623, 438/624, 625, 626, 631–638, 761–762, 763, 691, 692, 697–699, 778–782, 788–792

[56] References Cited

U.S. PATENT DOCUMENTS

| | | | |
|---|---|---|---|
| 5,246,884 | 9/1993 | Jaso et al. | 437/225 |
| 5,262,346 | 11/1993 | Bindal et al. | 437/62 |
| 5,324,690 | 6/1994 | Gelatos et al. | 437/236 |
| 5,362,669 | 11/1994 | Boyd et al. | 437/67 |
| 5,385,866 | 1/1995 | Bartush | 437/186 |
| 5,593,919 | 1/1997 | Lee et al. | 438/626 |
| 5,654,216 | 8/1997 | Adrian | 438/633 |
| 5,656,543 | 8/1997 | Chung | 438/625 |
| 5,723,380 | 3/1998 | Wang et al. | 438/624 |
| 5,763,954 | 6/1998 | Hyakutake | 438/624 |

*Primary Examiner*—Charles Bowers
*Assistant Examiner*—Thanh Nguyen
*Attorney, Agent, or Firm*—George O. Saile; Stephen B. Ackerman; Rosemary L. S. Pike

[57] ABSTRACT

An improved method of gap filling and planarization in the dielectric layer by combining an anti-reflective coating with a CMP etch stop is described. Semiconductor device structures are provided in and on a semiconductor substrate. A conducting layer is deposited overlying the surfaces of the semiconductor device structures. A hard mask is deposited overlying the conducting layer wherein the hard mask acts as an anti-reflective coating. The conducting layer and the hard mask are patterned to form conducting lines wherein a gap is formed between the conducting lines. A first dielectric layer is deposited over the surfaces of the conducting lines wherein the gap remains between the conducting lines. A second dielectric layer is deposited overlying the first dielectric layer wherein the gap is filled by the second dielectric layer. The first and second dielectric layers are planarized wherein the hard mask acts as an etch stop or a polish stop. A third dielectric layer is deposited over the planarized first and second dielectric layers completing the fabrication of the integrated circuit device.

18 Claims, 4 Drawing Sheets

METHODS FOR GAP FILL AND PLANARIZATION OF INTERMETAL DIELECTRICS

RELATED PATENT APPLICATION

1) Co-pending U.S. patent application Ser. No. 08/767,009 (CS96-035) filed on Dec. 16, 1996 to S. Chooi et al.

BACKGROUND OF THE INVENTION (1) Field of the Invention

The present invention relates to the fabrication of integrated circuit devices, and more particularly, to a method of improving the gap filling and planarization characteristics of a dielectric layer in the fabrication of integrated circuits.

(2) Description of the Prior Art

Current practice for filling gaps between portions of a patterned metal layer involves using spin-on-glass or a high density plasma (HDP) oxide for gap filling followed by planarization such as by chemical mechanical polishing (CMP). A typical example is illustrated in FIGS. 1 through 3. Referring now to FIG. 1, there is illustrated a partially completed integrated circuit device. Semiconductor device structures such as gate electrode 14 and source and drain regions 16 have been fabricated in and on the semiconductor substrate 10, as is conventional in the art. A dielectric layer 18 has been deposited overlying the semiconductor device structures and planarized. A metal layer 20 has been deposited and patterned to form the desired metal pattern. The intermetal dielectric layer 22, such as silicon dioxide, is deposited conformally over the patterned metal layer 20. Spin-on-glass layer 24, for example, fills the gaps between the metal pattern.

Referring now to FIG. 2, the spin-on-glass layer 24 and the intermetal dielectric layer 22 are etched back. A second intermetal dielectric layer 26 is deposited over the etched back layers. An etch stop layer such as silicon nitride layer 28 may now be deposited followed by a glasseous layer such as phosphosilicate glass (PSG) layer 30. FIG. 3 illustrates the integrated circuit device after planarization by CMP.

The prior art process illustrated in FIGS. 1 through 3 has a number of drawbacks. There is little margin for the spin-on-glass etchback because the layer 22 has to be thin enough that it does not close at the top. Thinning of the dielectric film over wide trenches, called dishing, may occur and may effect final planarization if overpolished. This is because the polish rate for layer 30 is much faster than the polish rate for layer 28. Polishing of the layer 28 will slow down while the other areas are still being polished at a higher rate. Another drawback is that the stop layer 28 increases the capacitance in the circuit. Finally, the shape of the via etched through the PSG, etch stop, and second intermetal dielectric layers 30,28,26 is difficult to control because of the three different materials in these layers.

Co-pending U.S. patent application Ser. No. 08/650,694 (CS95-090) to J. Z. Zheng et al filed on May 20, 1995 teaches the use of titanium nitride, titanium tungsten, tungsten, and the like, as a polish stop layer. U.S. Pat. No. 5,262,348 to Bindal et al shows a method of forming nitride polish stops in the bottom of apertures. U.S. Pat. No. 5,362,669 to Boyd et al teaches forming a polish stop layer in the middle of a wide trench to prevent dishing. U.S. Pat. No. 5,324,690 to Gelatos et al teaches forming a ternary boron nitride film as a polish stop layer. U.S. Pat. No. 5,385,866 to Bartush teaches using an oxidized boron nitride polish stop layer. U.S. Pat. No. 5,246,884 to Jaso et al teaches a CVD diamond or diamond-like carbon polish stop layer.

SUMMARY OF THE INVENTION

Accordingly, it is a primary object of the invention to provide a process for improving the gap filling and planarization characteristics of the dielectric layer in the fabrication of integrated circuits.

It is a further object of the invention to provide a process for improving the gap filling characteristics of the dielectric layer while improving the margin for spin-on-glass etchback.

It is yet another object to provide a process for gap filling which avoids dishing due to overpolishing.

In accordance with the objects of the invention, an improved method of gap filling and planarization in the dielectric layer by combining an anti-reflective coating with a CMP etch stop is achieved. Semiconductor device structures are provided in and on a semiconductor substrate. A conducting layer is deposited overlying the surfaces of the semiconductor device structures. A hard mask is deposited overlying the conducting layer wherein the hard mask acts as an anti-reflective coating. The conducting layer and the hard mask are patterned to form conducting lines wherein a gap is formed between the conducting lines. A first dielectric layer is deposited over the surfaces of the conducting lines wherein the gap remains between the conducting lines. A second dielectric layer is deposited overlying the first dielectric layer wherein the gap is filled by the second dielectric layer. The first and second dielectric layers are planarized wherein the hard mask acts as an etch stop or a polish stop. A third dielectric layer is deposited over the planarized first and second dielectric layers completing the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
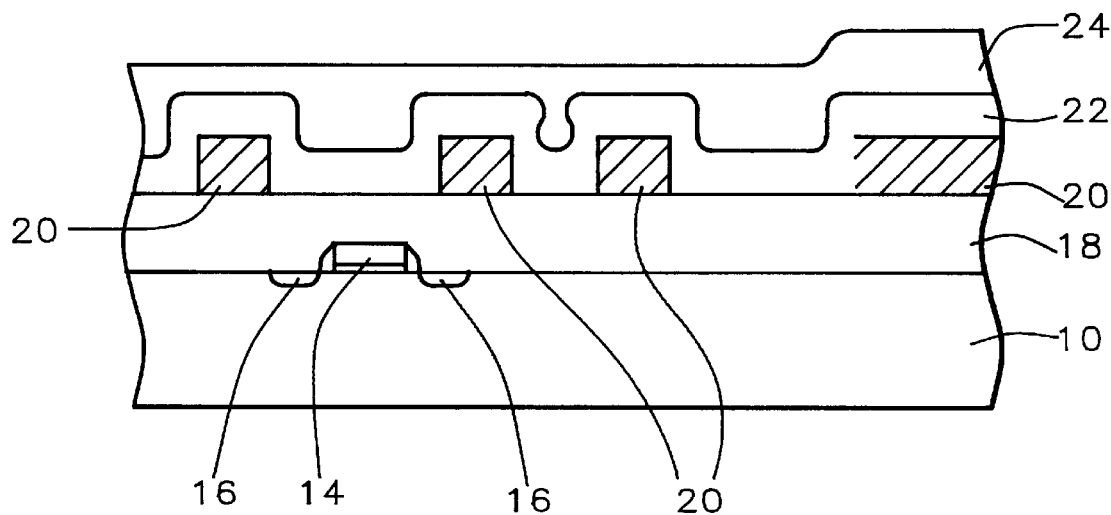
FIGS. 1 through 3 are cross-sectional representations of a process of the prior art.
Figure 2:
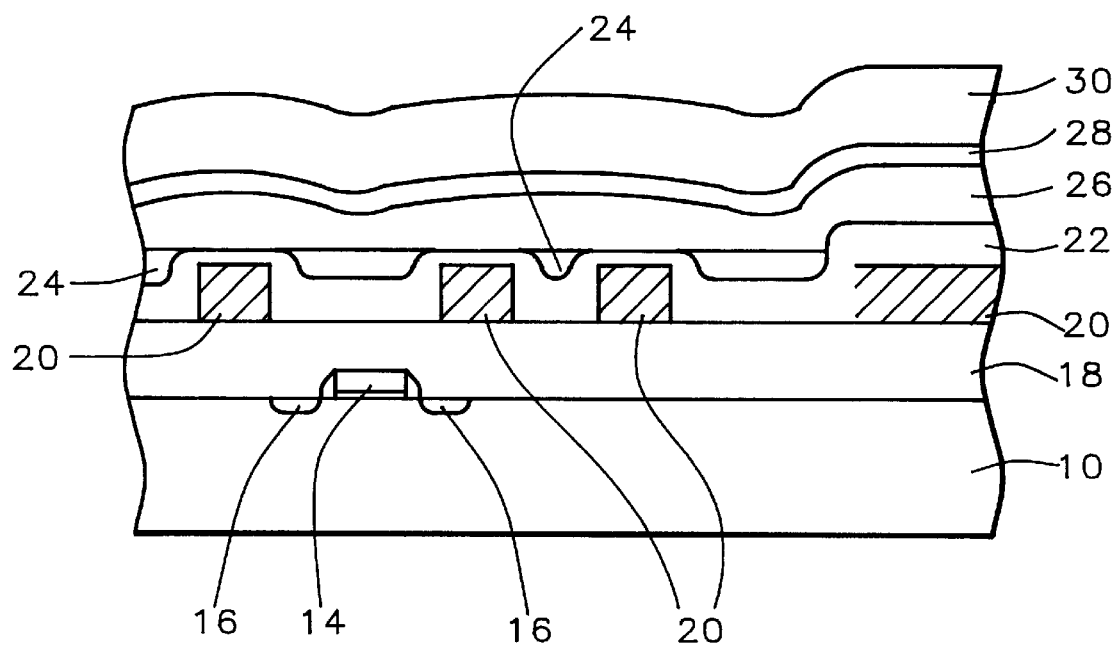
Figure 3:
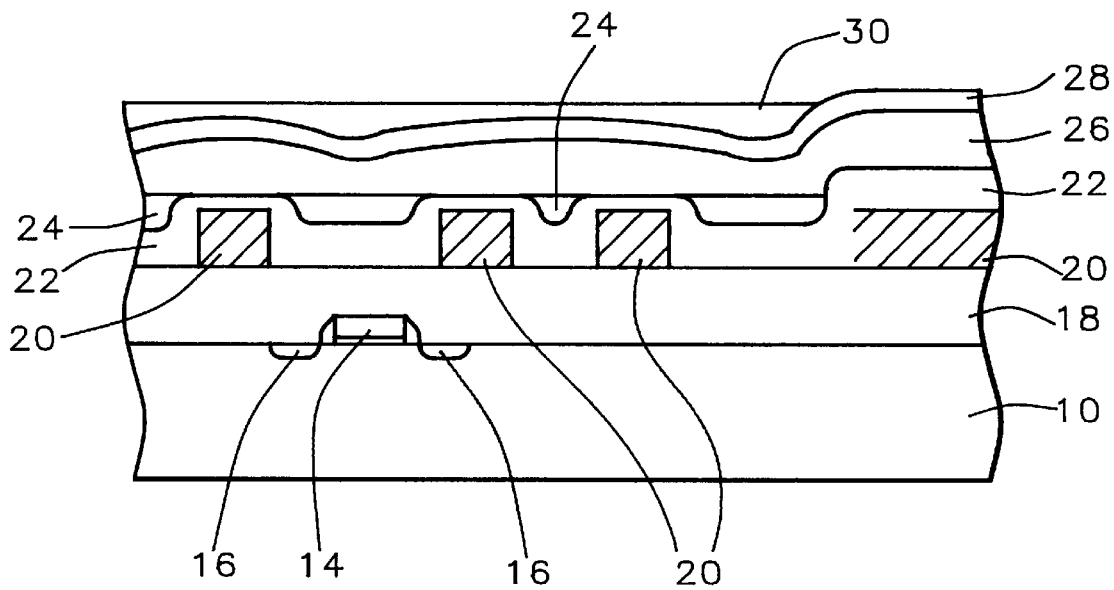
Figure 4:
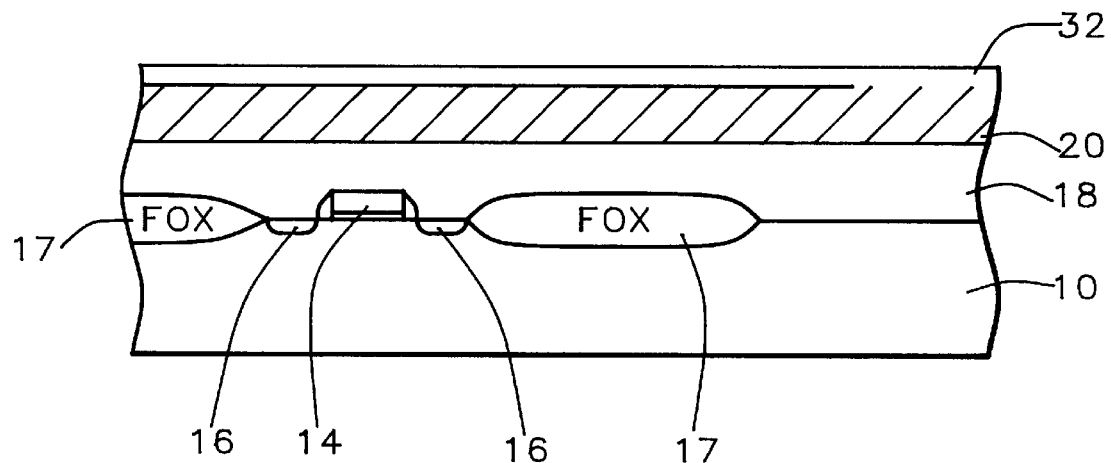
FIGS. 4 through 8 are cross-sectional representations of a preferred embodiment of the present invention.

The process of the present invention will be described in detail with reference to FIGS. 4 through 8. Referring now more particularly to FIG. 4, there is shown a semiconductor substrate 10, in which may be formed semiconductor device structures which may include a polysilicon gate electrode 14 and source and drain regions 16, separated from other device structures, not shown, by Field OXide region 17. An insulating layer 18 covers the semiconductor device structures and is planarized, such as by chemical mechanical polishing (CMP).

A layer of conducting material 20 is deposited over the surface of the semiconductor substrate. The conducting material may be metal, such as Ti/TiN/Al—Cu, Ti/TiN/Ti/Al—Cu, or Ti/Al—Cu.

A hard mask is formed on the surface of the conducting layer 20. The mask may be formed of silicon nitride, silicon oxynitride, or boron nitride. This mask is used as both an anti-reflective coating and as a stopper for CMP or spin-on-glass etchback. The hard mask replaces the conventional titanium nitride anti-reflective coating and works as well as or better than the titanium nitride as an anti-reflective coating. The hard mask 32 is deposited over the surface of the conducting layer 20 using plasma-enhanced chemical vapor deposition (PECVD) at a temperature of between about 200° to 500 ° C.

A hard mask of silicon nitride is formed by flowing $SiH_4$ at a rate of between about 50 to 300 sccm, flowing $NH_3$ at between about 30 to 200 sccm, and flowing $N_2$ at 2000 to 4000 sccm. The silicon nitride layer is formed to a thickness of between about 500 to 800 Angstroms. The layer has a refractive index of 2.0 to 3.0 and an extinction coefficient of 0.2 to 0.8.

A hard mask of silicon oxynitride is formed by flowing $SiH_4$ at a rate of between about 50 to 200 sccm, flowing $N_2O$ at between about 50 to 200 sccm, and flowing He at 2000 to 4000 sccm. The silicon oxynitride layer is formed to a thickness of between about 600 to 1000 Angstroms. The layer has a refractive index of 2.0 to 3.0 and an extinction coefficient of 0.4 to 1.0.

A hard mask of boron nitride is formed by flowing $B_2H_6$ at a rate of between about 200 to 1000 sccm, flowing $NH_3$ at between about 50 to 300 sccm, and flowing $N_2$ at 2000 to 4000 sccm. Alternatively, the boron nitride hard could be formed by flowing $B_3N_3H_6$ at a rate of between about 50 to 30 sccm and flowing $N_2$ at 50 to 500 sccm. The boron nitride layer is formed to a thickness of between about 600 to 1000 Angstroms. The layer has a refractive index of 1.7 to 2.5 and an extinction coefficient of 0.1 to 0.5.

The preceding recipes differ from conventional recipes in that the deposition rate is much slower than is conventional for better process control. The refractive indices and extinction coefficients are higher than conventional. Light reflected from the surface of the hard mask and from the surface of the metal under the hard mask will have a 180° phase difference for certain refractive indices, extinction coefficients, and film thicknesses. Therefore, the hard mask of the invention, having these certain parameters, will work very well as an anti-reflective coating.

Figure 5:
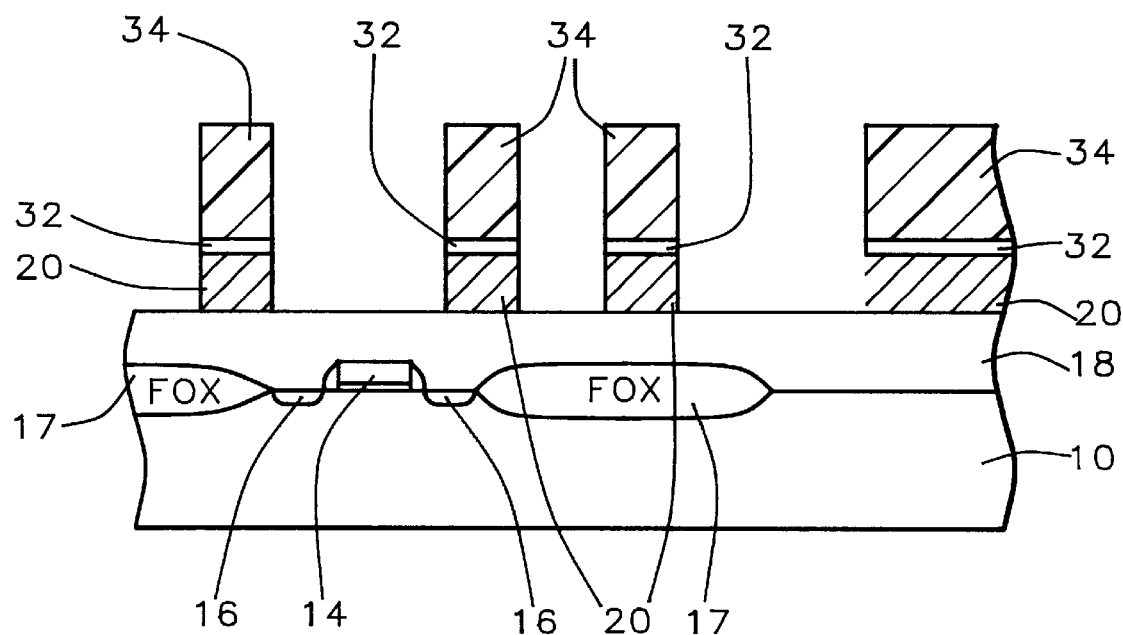

Referring now to FIG. 5, a photoresist mask 34 is formed overlying the hard mask 32. The conducting layer 20 and hard mask 32 are etched away where they are not covered by the photoresist mask to form the desired conducting layer pattern. The photoresist mask is removed.

Figure 6:
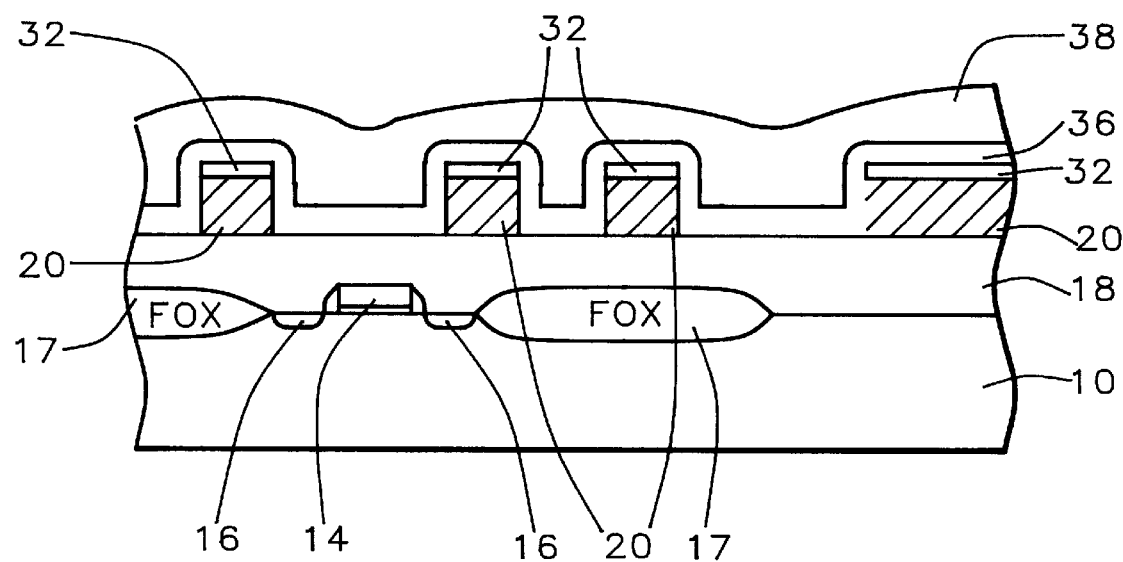

Next, an intermetal dielectric layer 36 is deposited conformally over the patterned conducting layer and hard mask, as illustrated in FIG. 6. This intermetal dielectric layer may comprise silicon dioxide with a thickness of between about 500 and 6000 Angstroms. A layer of spin-on-glass, high density plasma (HDP) oxide, or ozone-TEOS (tetraethoxysilane) oxide 38 is coated over the intermetal dielectric layer 36 to fill the gaps between metal lines.

Figure 7:
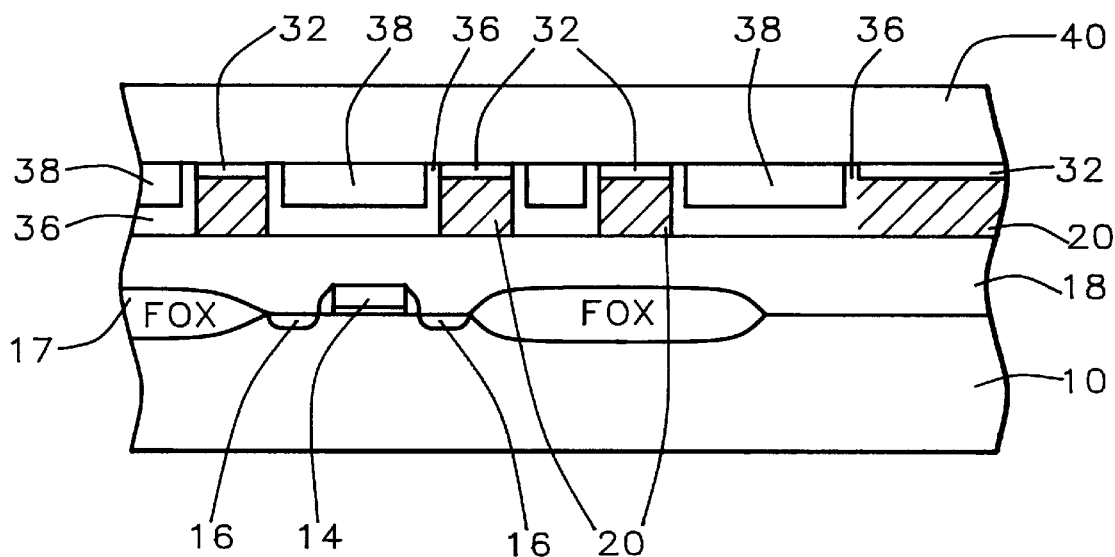

Referring now to FIG. 7, the integrated circuit is polished using CMP with a polish stop at the hard mask 32. If the gap-filling layer is a spin-on-glass, the integrated circuit device can be partially planarized using plasma etchback with $CHF_3/CF_4$ chemistry or by CMP where the hard mask acts as an etch stop or a polish stop. This results in a planarized surface. A second intermetal dielectric layer 40 is then deposited over the planarized surface. The dielectric layer 40 is further planarized using CMP, if necessary.

Figure 8:
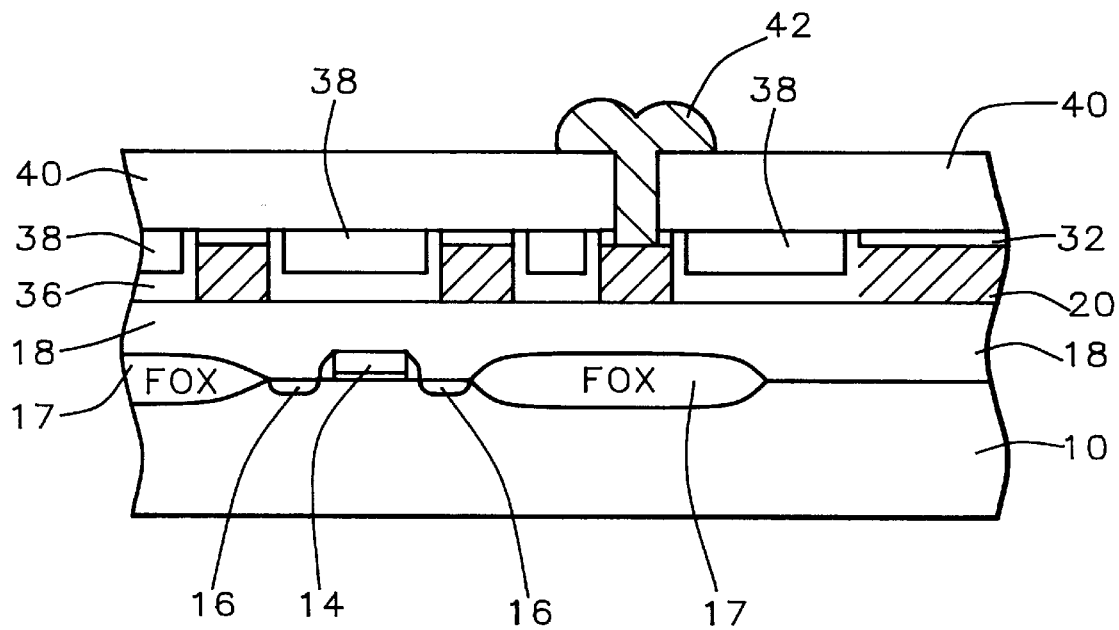

Via openings may be etched through the dielectric layer to form desired electrical connections to conducting lines 20, as shown in FIG. 8. The via openings are filled with a conducting material 42 which is patterned to complete fabrication of the integrated circuit device.

The process of the invention results in improved gap filling of spin-on-glass since a thinner layer 36 can be used because any excessive spin-on-glass on top of the wide metal lines will be polished away. The hard mask as polish stop improves the margin for spin-on-glass etchback so that the spin-on-glass with etchback process can be extended sub-0.25 metal line spacing. The process of the invention avoids dishing due to overpolishing which improves the CMP process margin. The via etch will be easier than in the prior art because only one layer material is etched rather than a sandwich structure of three layer materials as in the prior art. Capacitance is lowered by the process of the invention if the hard mask is composed of boron nitride because boron nitride has a low dielectric constant. If silicon nitride or silicon oxynitride are used for the hard mask, capacitance will increase slightly, but not so much as in the prior art because the hard mask is present only overlying the metal lines, not on the remainder of the circuit.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit device comprising:

providing semiconductor device structures in and on a semiconductor substrate;

covering said semiconductor device structures with an insulating layer and planarizing said insulating layer;

depositing a conducting layer overlying said insulating layer;

depositing a hard mask overlying said conducting layer wherein said hard mask acts as an anti-reflective coating;

patterning said conducting layer and said hard mask to form conducting lines wherein a gap is formed between said conducting lines;

depositing a first dielectric layer over the surfaces of said conducting lines wherein said gap remains between said conducting lines;

depositing a second dielectric layer overlying said first dielectric layer wherein said gap is filled by said second dielectric layer;

planarizing said first and second dielectric layers wherein said hard mask acts as an etch stop;

depositing a third dielectric layer over said planarized first and second dielectric layers;

etching via openings through said third dielectric layer and said hard mask to said conducting lines; and filling said via openings with a second conducting layer to complete electrical connections in the fabrication of said integrated circuit device.

2. A method according to claim 1 wherein said hard mask comprises silicon nitride having a thickness of between about 500 to 800 Angstroms and wherein said hard mask is formed by flowing $SiH_4$ at a rate of between about 50 to 300 sccm, flowing $NH_3$ at a rate of between about 30 to 200 sccm, and flowing $N_2$ at a rate of between about 2000 to 4000 sccm.

3. A method according to claim 1 wherein said hard mask comprises silicon oxynitride having a thickness of between about 600 to 1000 Angstroms and wherein said hard mask is formed by flowing $SiH_4$ at a rate of between about 50 to 200 sccm, flowing $N_2O$ at a rate of between about 50 to 200 sccm, and flowing He at a rate of between about 2000 to 4000 sccm.

4. A method according to claim 1 wherein said hard mask comprises boron nitride having a thickness of between about 600 to 1000 Angstroms and wherein said hard mask is formed by flowing $B_2H_6$ at a rate of between about 200 to 1000 sccm, flowing $NH_3$ at a rate of between about 50 to 300 sccm, and flowing $N_2$ at a rate of between about 2000 to 4000 sccm.

5. A method according to claim 1 wherein said hard mask comprises boron nitride having a thickness of between about 600 to 1000 Angstroms and wherein said hard mask is formed by flowing $B_3N_3H_6$ at a rate of between about 50 to 300 sccm and flowing $N_2$ at a rate of between about 50 to 500 sccm.

6. A method according to claim 1 wherein said second dielectric layer comprises spin-on-glass.

7. A method according to claim 1 wherein said second dielectric layer comprises high density plasma oxide.

8. A method according to claim 1 wherein said second dielectric layer comprises ozone-TEOS (tetraethoxysilane) oxide.

9. A method according to claim 1 wherein said planarizing is done by etching back said first and second dielectric layers.

10. A method according to claim 1 wherein said planarizing is done by chemical mechanical polishing.

11. A method of manufacturing an integrated circuit device comprising:

providing semiconductor device structures in and on a semiconductor substrate;

covering said semiconductor device structures with an insulating layer and planarizing said insulating layer;

depositing a conducting layer overlying said insulating layer;

depositing a hard mask overlying said conducting layer wherein said hard mask comprises one of the group containing silicon nitride, silicon oxynitride, and boron nitride and wherein said hard mask acts as an anti-reflective coating;

patterning said conducting layer and said hard mask to form conducting lines wherein a gap is formed between said conducting lines;

depositing a first dielectric layer over the surfaces of said conducting lines wherein said gap remains between said conducting lines;

depositing a second dielectric layer overlying said first dielectric layer wherein said gap is filled by said second dielectric layer;

planarizing said first and second dielectric layers wherein said hard mask acts as an etch stop;

depositing a third dielectric layer over said planarized first and second dielectric layers;

etching via openings through said third dielectric layer and said hard mask to said conducting lines; and filling said via openings with a second conducting layer to complete electrical connections in the fabrication of said integrated circuit device.

12. A method according to claim 11 wherein said hard mask comprises silicon nitride having a thickness of between about 500 to 800 Angstroms and wherein said hard mask is formed by flowing $SiH_4$ at a rate of between about 50 to 300 sccm, flowing $NH_3$ at a rate of between about 30 to 200 sccm, and flowing $N_2$ at a rate of between about 2000 to 4000 sccm.

13. A method according to claim 11 wherein said hard mask comprises silicon oxynitride having a thickness of between about 600 to 1000 Angstroms and wherein said hard mask is formed by flowing $SiH_4$ at a rate of between about 50 to 200 sccm, flowing $N_2O$ at a rate of between about 50 to 200 sccm, and flowing He at a rate of between about 2000 to 4000 sccm.

14. A method according to claim 11 wherein said hard mask comprises boron nitride having a thickness of between about 600 to 1000 Angstroms and wherein said hard mask is formed by flowing $B_2H_6$ at a rate of between about 200 to 1000 sccm, flowing $NH_3$ at a rate of between about 50 to 300 sccm, and flowing $N_2$ at a rate of between about 2000 to 4000 sccm.

15. A method according to claim 11 wherein said hard mask comprises boron nitride having a thickness of between about 600 to 1000 Angstroms and wherein said hard mask is formed by flowing $B_3N_3H_6$ at a rate of between about 50 to 300 sccm and flowing $N_2$ at a rate of between about 50 to 500 sccm.

16. A method according to claim 11 wherein said second dielectric layer comprises spin-on-glass.

17. A method according to claim 11 wherein said second dielectric layer comprises high density plasma oxide.

18. A method according to claim 11 wherein said second dielectric layer comprises ozone-TEOS.

* * * * *